US006663754B2

United States Patent
Gung

(10) Patent No.: US 6,663,754 B2
(45) Date of Patent: *Dec. 16, 2003

(54) TUBULAR MAGNET AS CENTER POLE IN UNBALANCED SPUTTERING MAGNETRON

(75) Inventor: Tza-Jing Gung, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/835,104

(22) Filed: Apr. 13, 2001

(65) Prior Publication Data

US 2002/0175074 A1 Nov. 28, 2002

(51) Int. Cl.[7] .............................................. C23C 14/35
(52) U.S. Cl. ................ 204/298.19; 204/298.2
(58) Field of Search ................ 204/298.2, 298.22, 204/298.19, 298.12

(56) References Cited

U.S. PATENT DOCUMENTS

| | | | |
|---|---|---|---|
| 4,632,719 A | * 12/1986 | Chow et al. | 156/345 |
| 4,746,417 A | 5/1988 | Ferenbach et al. | 204/298 |
| 4,872,964 A | 10/1989 | Suzuki et al. | 204/298 |
| 5,242,566 A | 9/1993 | Parker | 204/298.2 |
| 5,248,402 A | 9/1993 | Ballentine et al. | 204/298.2 |
| 5,284,564 A | 2/1994 | Maass | 204/298.2 |
| 5,320,728 A | 6/1994 | Tepman | 204/192.12 |
| 5,374,343 A | 12/1994 | Sasaki et al. | 204/298.2 |
| 5,556,519 A | * 9/1996 | Teer | 204/192.12 |
| 5,746,897 A | 5/1998 | Heimanson et al. | 204/298.2 |
| 5,770,025 A | 6/1998 | Kiyota | 204/298.2 |
| 5,795,451 A | 8/1998 | Tan et al. | 204/298.2 |
| 5,868,914 A | 2/1999 | Landsbergen et al. | 204/298.06 |
| 6,183,614 B1 | * 2/2001 | Fu | 204/298.2 |
| 6,290,825 B1 | * 9/2001 | Fu | 204/298.2 |

FOREIGN PATENT DOCUMENTS

| | | | |
|---|---|---|---|
| EP | 1 067 577 | 1/2001 | |
| EP | 1 076 352 | 2/2001 | |
| JP | 63 192 868 A | * 8/1988 | 204/298.19 |
| JP | 63-282263 | 11/1988 | |
| JP | 7-126844 | 5/1995 | |
| JP | 7-252651 | 10/1995 | |
| JP | 9-41135 | 2/1997 | |
| JP | 9-41135 | 10/1997 | |
| JP | 10088339 | 4/1998 | |
| JP | 10-152774 | 9/1998 | |

OTHER PUBLICATIONS

Musil et al., "Unbalanced magnetrons and new sputtering systems with enhanced plasma ionization", *J. Vac. Sci. Technol. A*, vol. 9, No. 3, May/Jun. 1991, pp. 1171–1177.

* cited by examiner

*Primary Examiner*—Patrick Ryan
*Assistant Examiner*—Gregg Cantelmo
(74) *Attorney, Agent, or Firm*—Charles S. Guenzer

(57) ABSTRACT

A DC magnetron sputter reactor capable of creating a self-ionized plasma and including a small unbalanced magnetron rotating about the back of the target. The magnetron includes an outer pole of one magnetic polarity in a closed band shape surrounding an inner pole of the opposed magnetic polarity and of lesser total magnetic intensity. The inner pole, for example, including a tubular magnet has a central, magnet free passage allowing magnetic field to pass therethrough from one side to the other of the inner pole. The outer band may be generally triangular with the base and apex composed of circular segments smoothly joined to straight sides. The pole face of the inner pole may be cantilevered away from the inner pole towards the apex of the outer pole.

22 Claims, 5 Drawing Sheets

TUBULAR MAGNET AS CENTER POLE IN UNBALANCED SPUTTERING MAGNETRON

BACKGROUND OF THE INVENTION

1. Field of the Invention

The invention relates generally to sputtering of materials. In particular, the invention relates to the magnetron creating a magnetic field to enhance sputtering.

2. Background Art

Sputtering, alternatively called physical vapor deposition (PVD), is the most prevalent method of depositing layers of metals and related materials in the fabrication of semiconductor integrated circuits. The semiconductor industry typically uses DC magnetron sputtering in which a wafer to be sputter deposited is placed in opposition to a metal target across a plasma reactor chamber filled with an argon working gas. The target is biased sufficiently negatively with respect to the chamber that the argon is excited into a plasma. The positively charged argon ions are strongly accelerated toward the target and sputter metal atoms from the target. The metal atoms dislodged from the target fall at least in part on the wafer and are deposited in a layer thereon.

In metal sputtering, the target or its least its inner surface has substantially the same metallic composition as that desired for the sputter deposited layer, for example, aluminum, copper, titanium, tantalum, tungsten, etc. In reactive sputtering, a chemically reactive gas such as nitrogen is additionally supplied into the chamber and the reactive gas reacts with sputtered metal atoms near the wafer surface to deposit a metal compound on the wafer, such as the refractory metal nitrides TiN, TaN, WN. The refractory nitrides are particularly useful as barrier layers between a dielectric and a later sputtered metal layer, and the associated refractory metal is often used as a glue layer promoting adhesion of the metal to the dielectric. Accordingly, it is often advantageous to use the same sputter reactor to deposit a bilayer liner of, for example, Ti/TiN, Ta/TaN, or W/WN. Sputtering is also used to coat the sides of a via hole with a thin copper seed layer that nucleates and provides an electrode for subsequent filling of copper into the hole by electrochemical plating (ECP).

However, for advanced integrated circuits, sputtering suffers from the fundamental problem that sputter deposition, as described above, is primarily a ballistic process between the target and wafer in which the sputtered atoms are emitted in a broad pattern about the normal to the target. Such a distribution is ill suited to filling narrow holes, such as via holes extending through an inter-level dielectric layer separating two layers of metallization. Such via holes in advanced devices have aspect ratios of 3:1 and greater. A broad sputtering pattern causes the top of the hole to close before the bottom is filled. That is, voids are created in the sputtered via metallization. Similarly, sputtered liner layers tend to be much thicker at the top of the via hole than at the bottom.

One method of adapting sputtering to deep hole filling, as well as other applications, is self-ionized plasma (SIP) sputtering, as disclosed by Fu in U.S. patent application Ser. No. 09/249,468, filed Feb. 12, 1999 and now issued as U.S. Pat. No. 6,290,825. and by Chiang et al. in U.S. patent application Ser. No. 09/414,014, filed Oct. 8, 1999 and now issued as U.S. Pat. No. 6,398,929, both incorporated herein by reference in their entities. SIP sputtering allows a significant fraction of the sputtered atoms to be ionized using a somewhat conventional sputtering reactor. The sputtered metal ions can be electrically attracted into narrow via holes in the wafer. Furthermore, the sputtered metal ions can in part be attracted back to the target to further sputter the target, thereby allowing the pressure of the argon working gas to be significantly decreased. In the case of copper, it is possible to eliminate the need for the argon working gas after the plasma has been ignited in a process called sustained self-sputtering (SSS).

An example of a SIP sputter reactor 10 is schematically illustrated in cross section in FIG. 1. It includes chamber wall 12 supporting a biased metal target 14 through a dielectric isolator 16. A wafer 18 is held on a pedestal electrode 20 by, for example, a clamping ring 22 although an electrostatic chuck may alternatively be used. The chamber walls 12 are protected from sputter deposition by an electrically grounded shield 24, which also acts as an anode to the target cathode. An electrically floating shield 26 supported on a second dielectric isolator 28 is arranged about a central chamber axis 30 between the grounded shield 24 and the target 14. A negative charge inherently builds up on the floating shield 26 during sputtering and repels plasma electrons, thereby reducing electron leakage and extending the plasma closer to the wafer 18.

Argon working gas is supplied into the chamber 12 from a gas supply 32 and is metered by a mass flow controller 34. The working gas flows into the processing region through a gap 35 between the pedestal 20, the grounded shield 24, and the wafer clamp 22. A vacuum pumping system 36 connected to a pumping port 38 maintains the interior of the chamber 12 at a low but controllable pressure. A negative DC power supply 40 biases the target 14 to about −600 VDC, which after ignition excites the argon working gas into a plasma. The negative bias attracts the ions to the target 14, where they sputter target atoms, which are thereafter deposited on the wafer 18 to form a layer of sputtered material. An RF power supply 42 applies RF power to the pedestal electrode 20, which causes it to develop a negative DC self-bias in the presence of a plasma. A computerized controller 44 controls the power supplies 40, 42, the mass flow controller 32, and the pumping system 36, thereby controlling the sputtering conditions.

A magnetron 50 is located in back of the target 14 to generate a magnetic field adjacent to the front (bottom) of the target 14. The magnetic field traps electrons, which raises the plasma density in a high-density plasma region 52, thereby increasing the sputtering rate. An argon chamber pressure of about 6 to 10 milliTorr is typically required to ignite the plasma. However, if the density of metal ions in the high-density plasma region 52 is sufficiently high, the supply of argon can be reduced and sometimes eliminated so that a significant portion if not all of the target sputtering is effected by metal ions in the SIP process. Chamber pressure for SIP sputtering can be reduced to well below 1 milliTorr. The very low sputtering pressures are advantageous in reducing scattering of the sputtered atoms as they move towards the wafer and in reducing the temperature of the wafer since energetic argon ions are no longer bombarding it.

SIP sputtering is promoted by high target power and a small-area intense magnetic field produced by the magnetron 50, as well as designing the magnetron to minimize plasma leakage to the shields and target. Such a magnetron 50 includes an inner magnet pole 53 of one magnetic polarity surrounded by an outer magnet pole 54 of the other magnetic polarity in a nested configuration. One or both magnet poles 53, 54 may be composed of multiple magnets with perhaps a pole face linking the magnets within the pole. The illustrated magnetic polarities are the polarities at one end of the magnets with the other ends having the unillustrated opposite polarity. The inner and outer magnet poles 53, 54 are magnetically coupled by a magnetic yoke 56 on their sides away from the target 30. The magnetron 50 is an unbalanced magnetron in which the total magnetic flux, that is, flux density integrated over the surface of the pole face, produced by the outer pole 54 is significantly larger than the total magnetic flux produced by the inner pole 53, for example, by a factor of at least 1.5. The integrated magnetic flux may be referred to as the total magnetic intensity. The unbalanced magnetron 50 produces a magnetic field distribution which has components extending from the outer pole 54 far towards the wafer 18, thereby extending the plasma and guiding the metal ions towards the wafer 18.

The magnetron 50 has a relatively small area and is disposed away from the central chamber axis 30. An unillustrated motor drives a motor shaft 58 extending along the central axis and supporting the magnetron 50 through the magnetic yoke 56. Thereby, the magnetron is swept around the target 14 to produce a circularly symmetric erosion pattern.

Many configurations have been suggested for the SIP magnetron. Most of them suffer from one or more deficiencies. The sputtering rate is controlled in large part by the component of magnetic field parallel and close to the target surface. The horizontal component of magnetic field is relatively low in prior SIP magnetrons. Bringing the outer pole closer to the inner pole would increase the horizontal magnetic field but would likely worsen the sputtering uniformity from an already small-area magnetron. On the other hand, enlarging the inner pole to bring it closer to the outer pole, assuming each is composed of magnets of similar magnetic flux density, would reduce the unbalance between the two poles and thus reduce the magnetic field reaching towards the wafer, which guides the metal ions toward the wafer. The low magnetic flux density presents an acute problem near the outer periphery of the target, generally close to the outer edge of the outer pole. Sputtered metal atoms redeposit in the low-field peripheral region and are not resputtered. The redeposited metal does not bond well to the target. As a result, at increasing thicknesses of layer of redeposited metal, the layer tends to peel from the target, producing deleterious particles in the chamber.

A typical magnetron used for conventional sputtering includes closely spaced tracks of opposed poles in a closed pattern, for example, as disclosed by Tepman in U.S. Pat. No. 5,320,728 or Parker in U.S. Pat. No. 5,242,566. Often, horseshoe magnets arranged along the closed pattern are coupled to two continuous pole faces. While this design produces a very intense magnetic field between the closely spaced tracks, the poles have equal magnetic intensity, that is, are balanced, so that they do not produce the projecting magnetic field desired for SIP.

A further problem arises from the desire to reduce the argon pressure so that the plasma is barely supported and is operating in conditions close to extinguishment. Such a plasma is unstable. Even if it does not extinguish, it may change in intensity and distribution, effects which degrade the desired uniformity of sputter deposition.

SUMMARY OF THE INVENTION

A magnetron useful for DC sputtering having an inner pole of one magnetic polarity surrounded by an outer pole of another polarity. The inner pole may be composed of a tubular magnet having an axial passageway through which the magnetic field lines may pass from the front of the tubular magnet to its rear. A similar effect is obtained by multiple magnets arranged in a closed band.

The magnetron is preferably an unbalanced magnetron in which the total magnetic flux of the outer pole is significantly greater than that of the inner pole, for example, in a ratio of at least 1.5.

The magnetic field produced by the tubular magnet creates a minimum or maximum in the axial magnetic field near the tubular magnet. This location is a saddle point of the magnetic field. The saddle point should be located on the processing side of the target. Such a placement creates a plasma reservoir.

In another aspect of the invention, a magnetic pole face on the inner magnet has a portion cantilevered away from the magnet, preferably in a direction facing the apex side of a generally triangular outer magnet assembly. Such a configuration may produce a magnetic flux that varies in the azimuthal direction from the inner magnet.

The invention further includes a magnetron having an outer pole of a generally triangular shape surrounding an inner pole of the opposite magnetic polarity. The outer pole has a shape of a closed bands of two straight portions inclined with respect to each other by between 35° and 65° and further of two circular arc segments smoothly joined to the end of the straight portions.

DETAILED DESCRIPTION OF THE PREFERRED EMBODIMENTS

Figure 1:
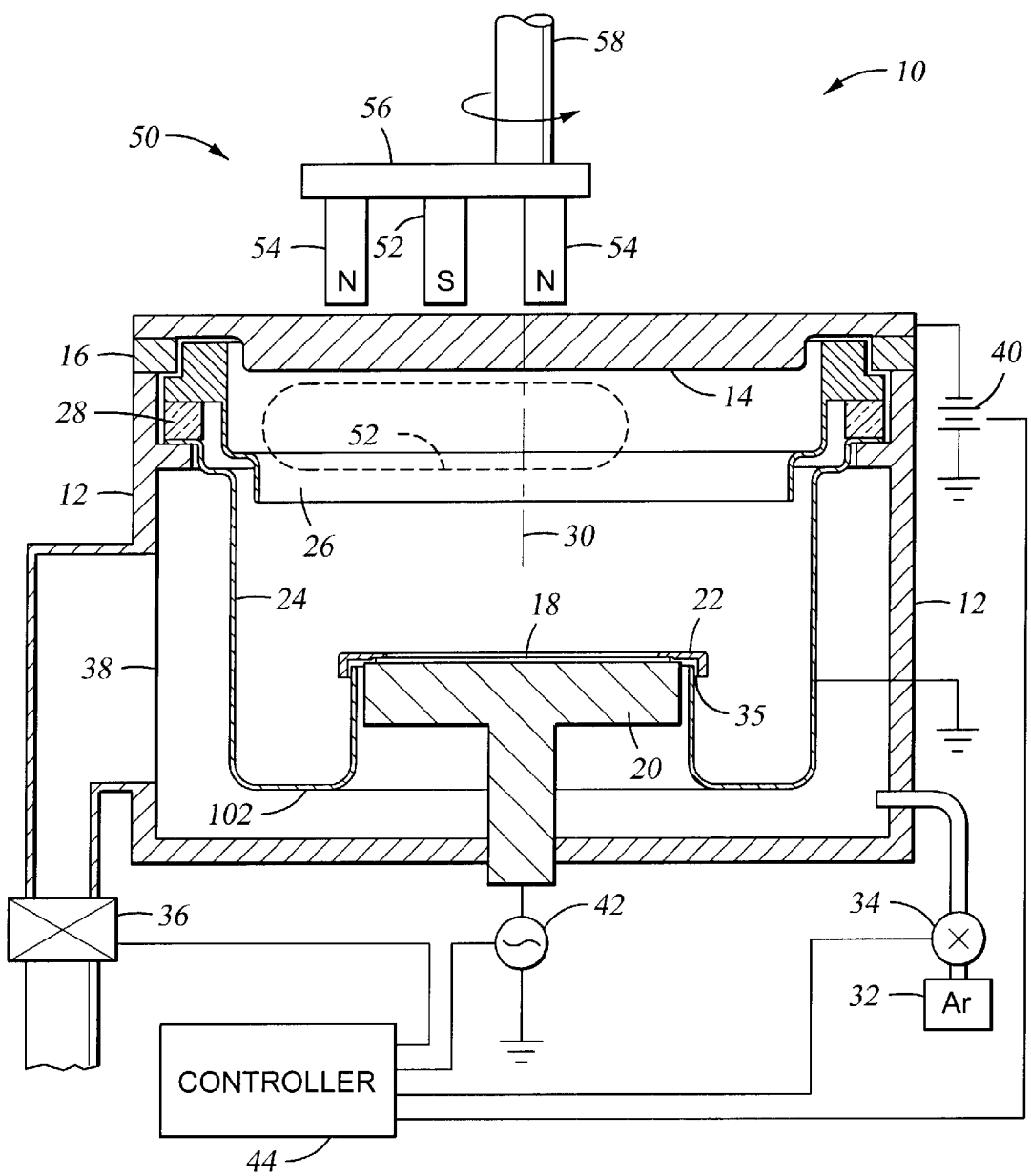
FIG. 1 is a cross-sectional view of a self-ionized plasma (SIP) sputter reactor.
Figure 2:
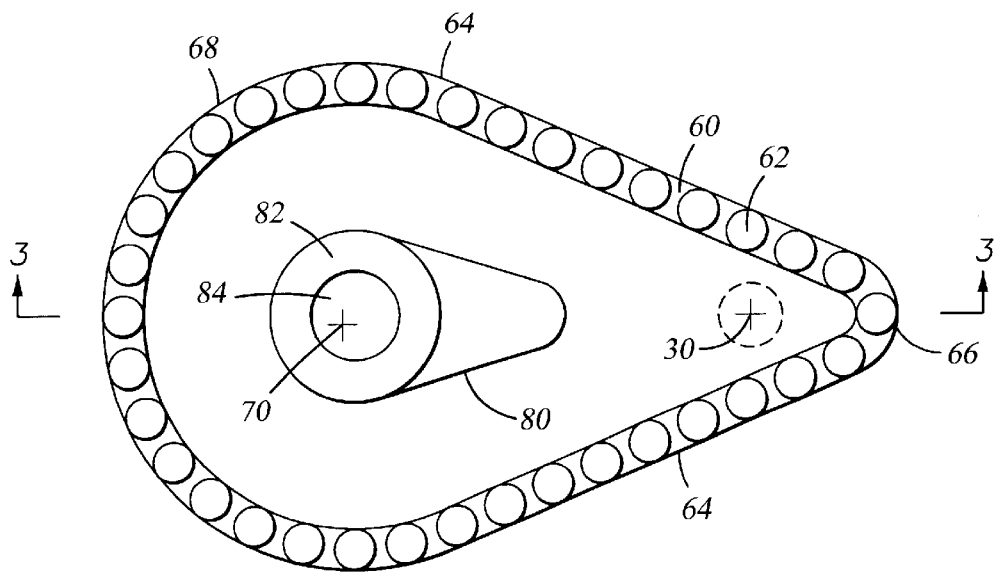
FIG. 2 is a downwardly facing sectional view of the more important magnetic elements of a magnetron of the invention.

On embodiment of the magnetron of the invention, to be incorporated into the magnetron sputtering reactor 10 of FIG. 1 as a replacement for the magnetron 50, is illustrated in a downwardly facing sectional view in FIG. 2. The outer pole of a first magnetic polarity is defined by an outer pole face 60 underlying a plurality of cylindrical magnet 62 of one magnetic polarity, for example, N. The pole face 60 is formed, for example, of a soft, magnetic material, such as SS410 stainless steel, as is the here unillustrated magnetic yoke. Both the pole face 60 and the cylindrical magnet 62 are arranged in a smoothly truncated triangular shape having two straight side portions 64 of preferably equal length inclined to each other and joined at their apex ends by a small arced portion 66 and at their base ends by a large arced portion 68. The large arced portion 68 extends over slightly more than 180° and is circularly symmetric about an arc center 70 falling on the axis of symmetry of the magnetron shaped generally like an isosceles triangle. The small arced portion 66 is also circularly symmetric, but with a smaller radius. The apex angle of the triangular shape, as illustrated, is 48°. Other values of the apex angle may be chosen, for example, in the range of 35° to 60°. The width of the band of the outer pole face 60 is approximately equal to the diameters of the cylindrical magnet 62 and includes a large aperture inside the closed band.

The inner pole of an opposed second magnetic polarity is defined by an inner pole face 80 formed also in a smoothly truncated triangular shape from a soft, magnetic material, and a tubular magnet 82 of the magnetic polarity opposite that of the cylindrical magnets, for example, S. The tubular magnet 82 is circularly symmetric having an outer diameter $D_1$ and a lesser inner diameter $D_2$, within which is formed a circular void 84. The inner pole face 80 includes a central aperture substantially coincident with the void 84 of the tubular magnet 82, that is, of diameter $D_2$. It extends over all of the tubular magnet 82 excluding the void 84. In the illustrated embodiment, the arc center 70 is located within the void 84 of the tubular magnet 82, relatively close to but offset from the center of the circularly symmetric tubular magnet 72 along the symmetry axis so the gap between the tubular magnet 82 and the large arced portion 68 of the outer pole face 60 is almost constant.

The magnetron is unbalanced in that the total magnetic strength of the outer pole is substantially greater than that of the inner pole, for example, by a factor of at least 1.5. Assuming that all the magnet 62, 82 are composed of the same magnetized material and have equal lengths, the ratio of magnetic strengths can be approximated by the ratio of the total area of the outer magnet 62 compared to the area of the tube part of the tubular magnet 82. The design of FIG. 2 corresponds to a ratio of about 2.5.

The two illustrated poles rotate about the rotation center 30 located within the aperture of the outer pole piece 60 but relatively closer to the outer tip of the small arced portion 66 than to any portion of the inner pole. As illustrated in the sectional view of FIG. 3 taken along view line 3—3 of FIG. 2, the magnet 62, 82 and their associated poles faces 60, 80 are attached by illustrated screws to a magnetic back yoke 86, which the draft shaft 58 rotates about the rotation center 30, coincident with the chamber central axis. A cantilevered portion 88 of the inner pole face 80 projecting towards the rotation center 30 produces a smaller magnetic flux density towards the small arced portion 66 of the outer pole than an uncantilevered portion 89 produces towards the large arced portion 68 of the outer pole. However, the cantilevered portion 88 is not essential to all aspects of the invention. For example, much the same magnetic field distribution can be obtained with the inner pole face 80 being generally coincident with the one or more inner magnet 82 if the inner magnet 82 are arranged in a more complex shape than a tube or have varying magnetic strength.

The inclusion of the void 84 within the tubular magnet 82 has the effect of pushing the inner pole closer to the large arc portion 62 of the outer pole without decreasing the unbalance. As a result, the magnetic field at the inside face of the target 14 is more intense and more horizontal, thus increasing the sputtering rate there and also preventing redeposition buildup near the target periphery. The increased sputtering rate and reduction of peripheral redeposition have been experimentally verified.

Figure 4:
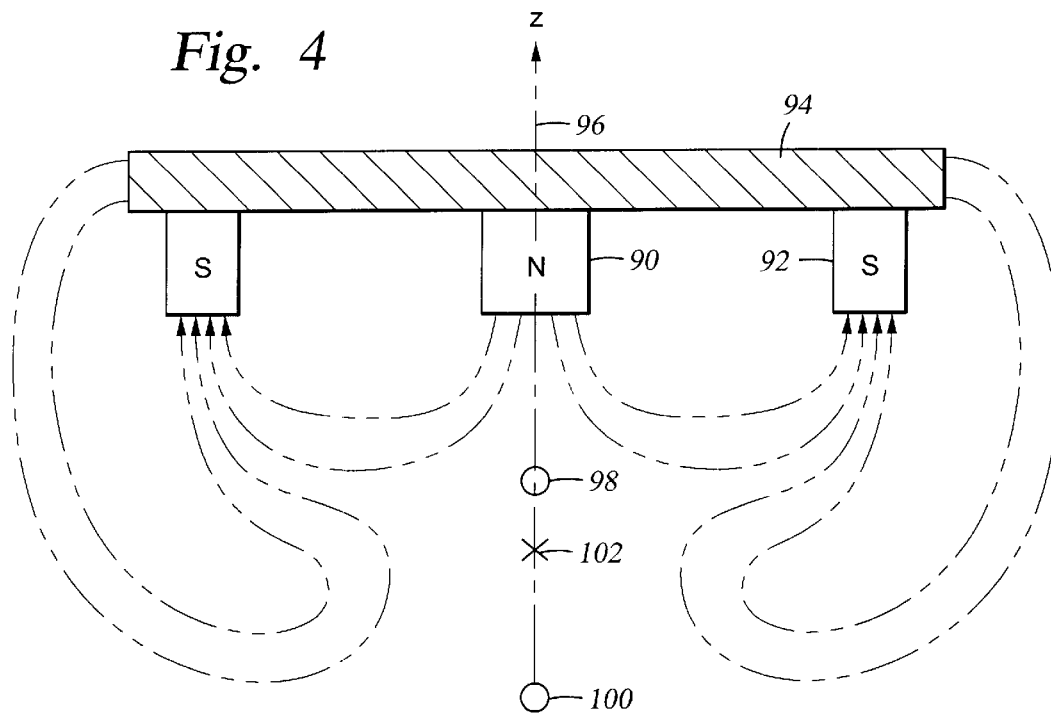
FIG. 4 is a schematic representation of the magnetic field distribution produced by an unbalanced magnetron having a solid center magnet.

Using the tubular magnet 82 for the inner pole creates a complex magnetic field distribution which can be engineered for beneficial results not available with other unbalanced magnetrons. A more typical unbalanced magnetron, schematically illustrated in the cross-sectional view of FIG. 4, has a solid cylindrical inner magnet 90 of one magnetic polarity and a surrounding annular outer magnet 92 of the other polarity coupled by a magnetic yoke 94. This model assumes that the magnet 90, 92 are circularly symmetric about a central axis 96. The total magnetic flux produced by the outer magnet 92 is substantially greater than that of the inner magnet 90. The resultant magnetic field distribution, as illustrated, includes not only field lines linking the inner and outer magnets 90, 92, but it further includes field lines extending from the stronger outer magnet 92 that bend toward the central axis 96 but then bend away, downwardly, and outwardly to close on the rear of the outer magnet 92. These latter field lines project far from the magnetron toward the wafer and are useful for guiding sputtered ions to the wafer and to prevent electron leakage to the chamber walls. The magnetic field distribution has one zero 98 where the two sets of field lines diverge and another zero 100 at infinity. In between there is located a maximum 102 of the z-component of the magnetic field $B_z$. Between the inner zero 98 and the inner magnet 90, the magnetic field is continuously increasing in amplitude.

Figure 5:
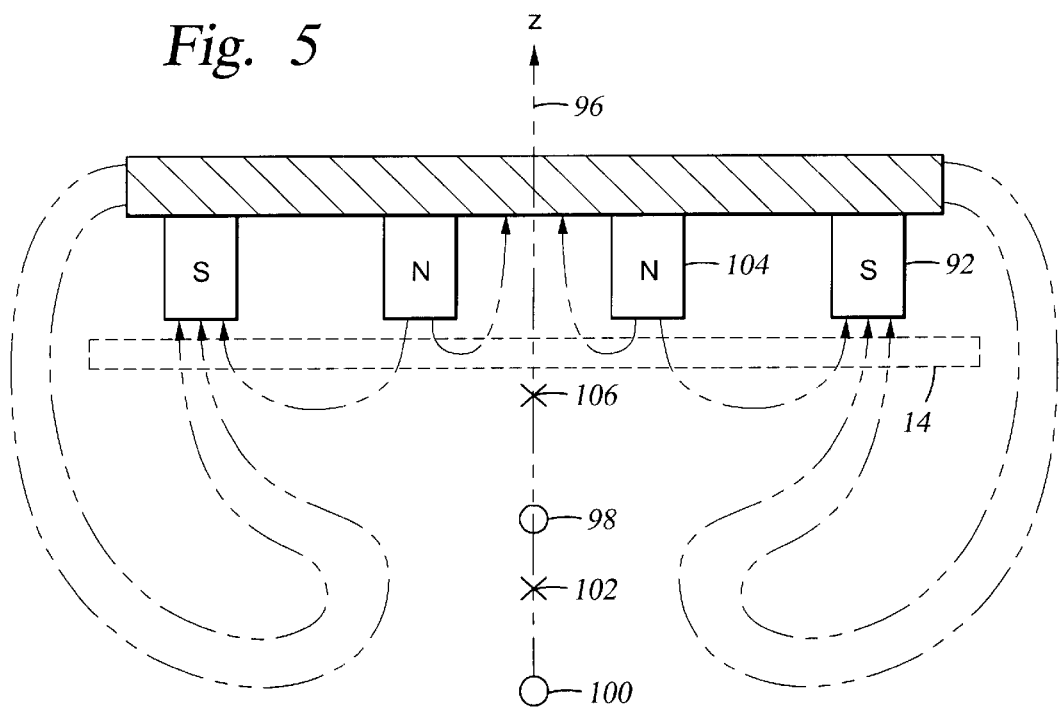
FIG. 5 is a schematic representation of the magnetic field distribution produced by an unbalanced magnetron of the invention have a hollow center magnet.

On the other hand, an unbalanced magnetron of the invention, illustrated schematically in the cross-sectional view of FIG. 5, includes an annularly shaped, hollow inner magnet 104, that is, tubular, of the same strength of the more typical solid inner magnet 90. The inventive magnetron's outer magnetic field distribution is much the same as that of the magnetron of FIG. 4 with zeroes 98, 100 and maximum 102, although these may be shifted somewhat along the z-directed central axis 96. However, the magnetic field distribution close to the hollow inner magnet 104 is determined in large part by the presence of the void in the inner magnet 104 since it allows magnetic field lines to pass through it between the front and the back of the hollow inner magnet 104. As a result, there is a non-zero minimum 106 in the value of $B_z$ relatively close to the hollow magnet 104. Note that the difference between minimum and maximum in the values of vector quantities is based on the choice of positive direction, which is mostly arbitrary for magnetic vectors. That is, the same results obtain with the mm/max 102 being a minimum or with the mm/max 102 being a maximum.

Figure 3:
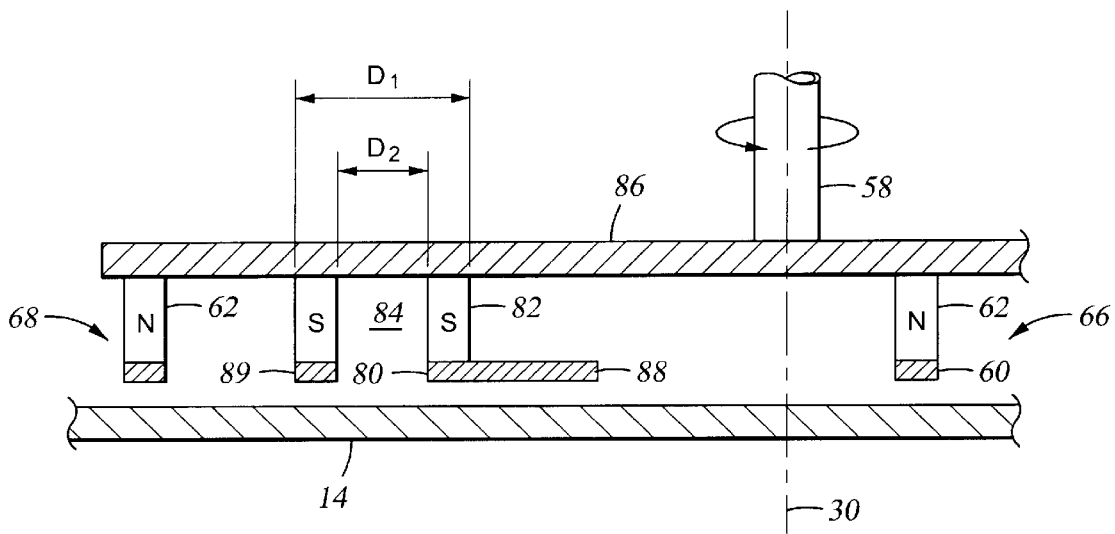
FIG. 3 is sectional view of the magnetron of FIG. 2 taken along view line 3—3.
Figure 6:
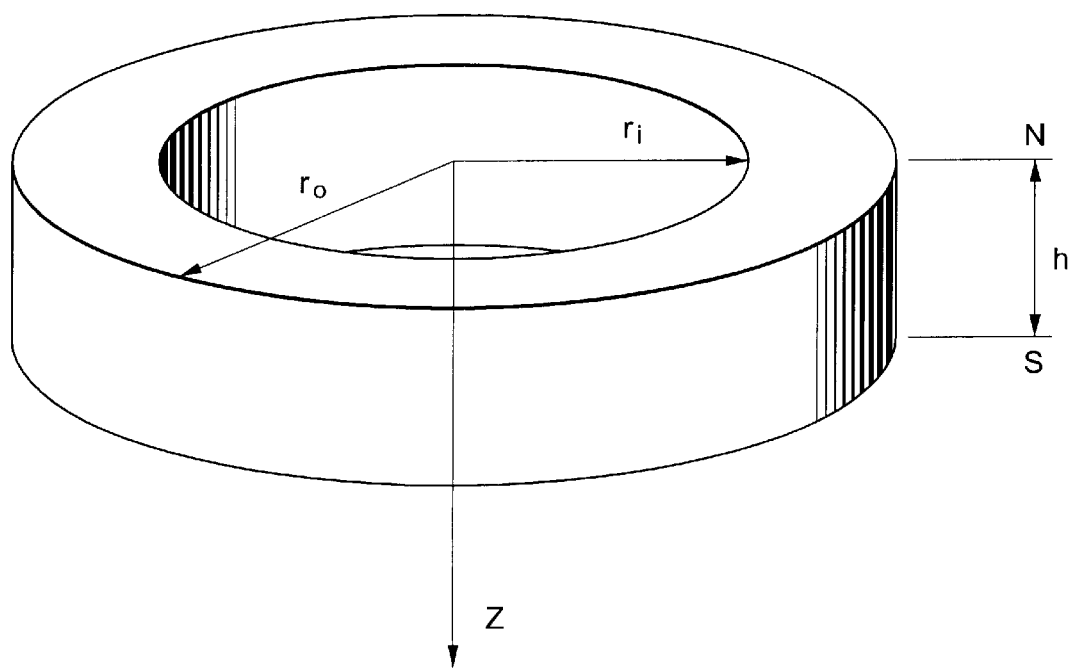
FIG. 6 is an orthographic representation of a hollow magnet used for a model calculation.

The existence of a mm/max 102 is demonstrated by a calculation of an even simpler model for a hollow inner magnet 110, illustrated orthographically in FIG. 6, without consideration of the outer magnet or the yoke. The coordinate system has changed somewhat from that of FIGS. 4 and 5. The tubular magnet has an outer diameter $r_o$ and an inner diameter $r_i$. With reference to FIG. 3, $r_o = D_1/2$ and $r_i = D_2/2$. The vertical magnetic field $B_z$ along the central axis, which is the only non-zero component on the axis, can be derived theoretically within this model.

$$|B_z|_{normalized} = \left( \frac{r}{z\sqrt{r^2 + z^2}} - \frac{r}{(z+h)\sqrt{r^2 + (z+h)^2}} \right)\Big|_{r_i}^{r_o}$$

The model is believed to be accurate in the region of interest directly in front of the hollow magnet. Note that for a void-free cylindrical magnet for which $r_i = 0$, the equation shows singularities at values for z of 0 and $-h$.

Figure 7:
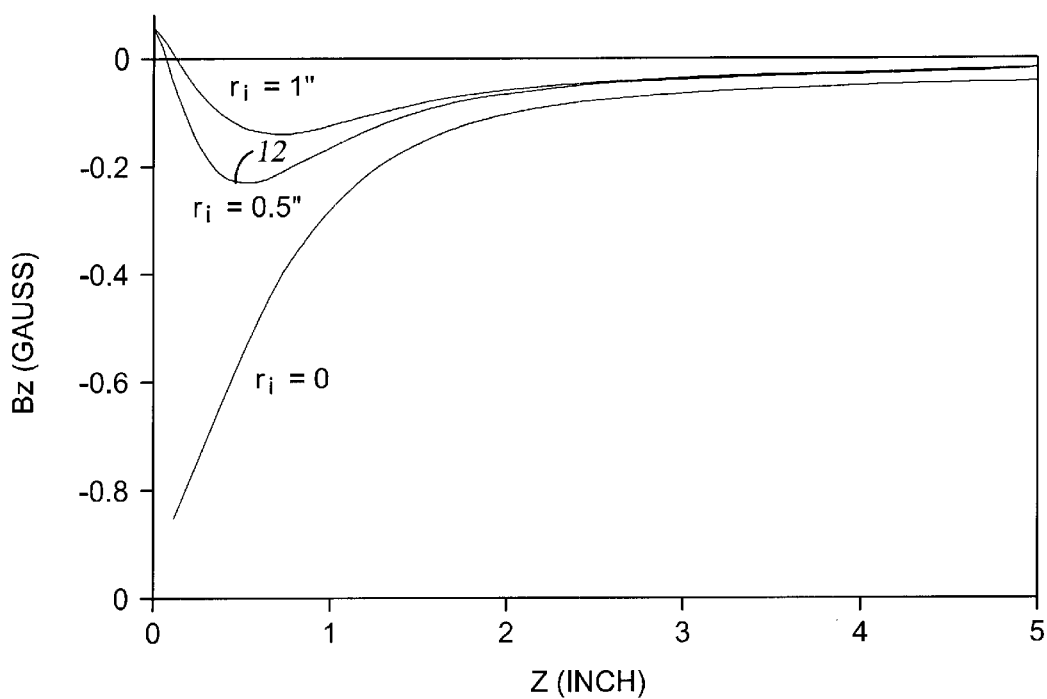
FIG. 7 is a plot of the vertical magnetic field produced by the magnet of FIG. 6 as a function of the distance from the magnet with the size of the magnet hole being a parameter.

Numerical results are plotted in FIG. 7 for the variation of the normalized vertical magnetic field $B_z$ as a function of the distance (expressed in inches) away from the closest face of the hollow magnet for various values of the inner radius $r_i$ expressed in inches for an inner magnet having a total area fixed at 4 square inches (25.8 cm²). Hollow magnets produce a maximum or minimum in the magnetic field. For example, at an inner radius $r_i$=0.5 inch (1.27 cm), there is a distinct maximum 112 at about 0.6 inch (1.5 cm) from the magnet. The calculation shows that there is no maximum/minimum near the central magnet for a solid magnet having $r_1$=0, consistent with the discussion of FIG. 4.

Figure 8:
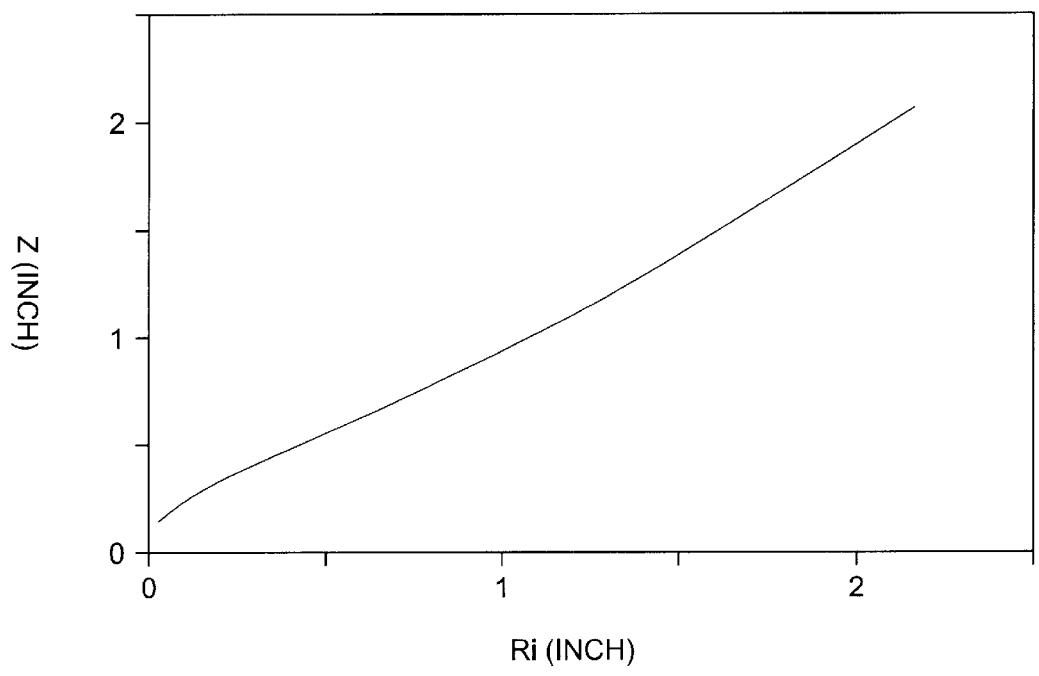
FIG. 8 is a plot of the dependence of the location of the innermost saddle point of the magnetic field distribution of FIG. 5 upon the size of the magnet hole.

The location of the min/max 106 depends on the size of the void in the hollow magnet. As illustrated by the plot of FIG. 8, the displacement of the location of the min/max from the magnet increases with increasing size of the void. The second of Maxwell's equations $$\nabla \cdot B = 0$$

for the cylindrical symmetry of the model may be expressed as $$\frac{\partial B_z}{\partial z} = -\frac{1}{r}\left(\frac{\partial (rB_r)}{\partial r}\right).$$

As a result, a minimum in the vertical magnetic field $B_z$ is coincident with a maximum of the radial magnetic field $B_r$ and vice versa. That is, the minima/maxima 102, 106 represent saddle points of the magnetic field.

The innermost saddle point 106 provides a mechanism for trapping charge in a three-dimensional space between that saddle point 106 and the target 14 in an effect similar to a magnetic bottle. The innermost saddle point 106 acts as a reflector for electrons having energy less than that necessary to cross over the saddle point 106. The plasma sheath voltage next to the negatively biased target 14 reflects electrons on the other side. However, for this trapping to be effective, the innermost saddle point 106 should be located on the processing side of the target 14. Otherwise, charge in the bottle is drained by the electrically biased target 14.

Such a region of trapped charge acts as a plasma reservoir. If the plasma in the rest of the chamber begins to fluctuate or even collapse, the plasma within the reservoir can replenish the plasma, thus damping the oscillations. Thereby, the stability of the plasma is improved. Except for the existence of the saddle point 106, there is no vertical confinement of the plasma. Instead, the magnetic field lines linking the inner and outer magnet 90, 92 only confine the plasma in a two-dimension pattern in r and θ. The saddle point 102 is too weak to confine electrons of energy typically present in the plasma.

Although the hollow inner magnet is accomplished in the above embodiment by a single tubular magnet, virtually the same magnetic field is obtained from a series of small cylindrical magnets arranged in a closed circular band and covered by an annular pole face having a width approximately equal to the diameters of the small cylindrical magnets.

Although the above embodiment included a hollow inner magnet, many of the same effects of the invention can be accomplished by more complex geometries in which the inner pole includes a closed band of highly magnetic material enclosing an inner region of significantly reduced magnetization. For example, the inner pole face could be relatively thin and only weakly magnetizable but extend over the void of the tubular magnet. Thereby, the magnetic flux density over the magnet void is finite but significantly less than over the tube part. It is understood that a hollow magnet includes a tubular magnet in which the central void is filled with a non-magnetic or substantially non-magnetic material in comparison to the magnet and yoke.

The feature of the cantilevered pole face may be applied to other magnetrons than one having a hollow inner pole. In an unbalanced nested magnetron, the cantilevered pole face allows the magnetic flux to be varied in the azimuthal direction of the inner pole.

What is claimed is:

1. A sputtering magnetron, comprising:
   an outer pole of a first magnetic polarity arranged in a first closed band including two straight portions inclined with respect to each other; and
   an inner pole of a second magnetic polarity opposite said first magnetic polarity included within said first closed band and arranged in a second closed band with an enclosed aperture of substantially reduced magnetization relative to said inner pole.

2. The sputtering magnetron of claim 1:
   wherein said outer pole comprises a plurality of first magnets of said first magnetic polarity and a first pole face of a magnetic material covering each respective side of said first magnets facing a first direction; and
   wherein said inner pole comprises at least one second magnet of said second magnetic polarity and a second pole face of a magnetic material covering a side of said at least one second magnet facing said first direction.

3. The sputtering magnetron of claim 2, wherein said second pole face includes a central aperture within said second closed band.

4. The sputtering magnetron of claim 2, wherein said second pole face is generally coincident with said at least one second magnet.

5. The sputtering magnetron of claim 1, wherein said two straight portions are smoothly joined at respective ends by two circular portions.

6. The sputtering magnetron of claim 1, wherein said inner pole comprises a tubular magnet.

7. The sputtering magnetron of claim 1, wherein said outer pole produces a total magnetic flux at least 1.5 times that of said inner pole.

8. A sputtering magnetron, comprising:
   an outer pole of a first magnetic polarity arranged in a first closed band and comprising a plurality of first magnets of said first magnetic polarity and a first pole face of a magnetic material covering each respective side of said first magnets facing a first direction; and
   an inner pole of a second magnetic polarity opposite said first magnetic polarity included within said first closed band, arranged in a second closed band with an enclosed magnet-free aperture, and comprising at least one second magnet of said second magnetic polarity and a second pole face of a magnetic material covering a side of said at least one second magnet facing said first direction and having a portion that is cantilevered away from said at least one second magnet in a second direction towards said first closed band.

9. The sputtering magnetron of claim 8, wherein said second pole face is not cantilevered away from said at least one second magnet towards said first closed band opposite said second direction.

10. The sputtering magnetron of claim 9, wherein said second closed band is further from said first closed band in said second direction than opposite said second direction.

11. An unbalanced magnetron, comprising:

an outer pole of a first magnetic polarity arranged in a first closed band having two straight portions inclined with respect to each other at an apex angle and two circular portions smoothly joined to respective ends of said straight portions, said first closed band enclosing a first aperture, said outer pole producing a first total magnetic intensity; and an inner pole of a second magnetic polarity opposite said first magnetic polarity disposed in said first aperture and producing a second total magnetic intensity, wherein a ratio of said first total magnetic intensity to said second total magnetic intensity is at least 1.5, wherein said inner pole is arranged in a second closed band with an enclosed second aperture having an area of substantially reduced magnetization than that present in said second closed band.

12. The magnetron of claim 11, wherein said apex angle is between 35° and 65°.

13. The magnetron of claim 11, wherein said inner pole includes a tubular magnet.

14. An unbalanced magnetron, comprising:

an outer pole of a first magnetic polarity arranged in a first closed band having a triangular shape with an apex end and a base end and producing a first total magnetic intensity; and an inner pole of a second magnetic polarity opposite said first magnetic polarity disposed in said first aperture and producing a second total magnetic intensity and comprising
   at least one magnet, and
   a pole face covering said at least one magnet and being cantilevered from a side thereof toward said apex end;

wherein a ratio of said first magnetic intensity to said second magnetic intensity is at least 1.5.

15. The magnetron of claim 14, wherein said pole face is less cantilevered from said at least one magnet towards said base end than towards said apex end.

16. The magnetron of claim 14, wherein said inner pole includes a tubular magnet with a second aperture and said pole face includes a third aperture overlying said second aperture.

17. The magnetron of claim 14, wherein said first closed bands have two straight portions inclined with respect to each other at an apex angle of between 35° and 65°.

18. A magnetron sputter reactor, comprising:

a vacuum chamber configured to support a substrate therein and a sputtering target in opposition to said substrate; and a unbalanced magnetron rotatable about a back of said target and including
   an outer pole of a first magnetic polarity arranged in a first closed band, and
   an inner pole of a second magnetic polarity opposite said first magnetic polarity included within said first closed band and arranged in a second closed band with an enclosed aperture of substantially reduced magnetization.

19. The reactor of claim 18, wherein said inner pole includes a tubular magnet.

20. The reactor of claim 14, wherein a total magnetic flux of said outer pole is at least 1.5 that of said inner pole.

21. A magnetron sputter reactor, comprising:

a vacuum chamber configured to support a substrate therein and a sputtering target in opposition to said substrate; and an unbalanced magnetron rotatable about a back of said target and including
   an outer pole of a first magnetic polarity arranged in a first closed band, and
   an inner pole of a second magnetic polarity opposite said first magnetic polarity included within said first closed band and arranged in a second closed band with an enclosed aperture of substantially reduced magnetization relative to said second closed band, wherein said inner pole includes at least one magnet arranged in a third closed band overlaid by said second closed band, and
   a pole piece disposed adjacent an end of said at least one magnet in the form of said second closed band, and cantilevered more from said third closed band in a first direction than in a second direction opposite said first direction.

22. The reactor of claim 21, wherein said first closed band is closer to said third closed band in said second direction than in said first direction.

* * * * *